United States Patent [19]
Ledermann et al.

[11] Patent Number: 4,934,309
[45] Date of Patent: Jun. 19, 1990

[54] SOLDER DEPOSITION SYSTEM

[75] Inventors: Peter G. Ledermann, Pleasantville; Luu T. Nguyen, Hopewell Junction, both of N.Y.

[73] Assignee: International Business Machines Corporation, Armonk, N.Y.

[21] Appl. No.: 407,163

[22] Filed: Sep. 14, 1989

Related U.S. Application Data

[62] Division of Ser. No. 181,775, Apr. 15, 1988, Pat. No. 4,898,117.

[51] Int. Cl.$^5$ .............................................. B05C 1/02
[52] U.S. Cl. ...................................... 118/50; 118/58; 118/74; 118/410
[58] Field of Search ............... 118/74, 400, 413, 421, 118/429, 202, 240, 241, 242, 256, 300, 410, 50, 58; 228/51-55, 218, 219, 243, 242, 180.2; 427/96, 216, 217; 222/595, 591, 593, 600, 603

[56] References Cited

U.S. PATENT DOCUMENTS

| 1,701,894 | 2/1929 | McCue | 228/52 |
| 2,689,901 | 9/1954 | Obolensky | 228/53 |
| 2,761,417 | 9/1956 | Russell et al. | 118/410 |
| 2,790,058 | 4/1957 | De Verrier | 228/53 |
| 2,884,922 | 5/1959 | Paulsen | 118/410 |
| 2,891,308 | 6/1959 | Lyons | 228/41 |
| 3,088,434 | 5/1963 | Sprague et al. | 118/410 |
| 3,104,986 | 9/1963 | Coman et al. | 118/410 |
| 3,112,723 | 12/1963 | Potocki | 118/410 |
| 3,218,193 | 11/1965 | Isaacson | 118/74 |
| 3,314,573 | 4/1967 | Newton | 222/146.5 |
| 3,589,590 | 6/1971 | Fitzsimmons | 118/410 |
| 3,604,108 | 9/1971 | Mallery | 29/593 |
| 3,661,638 | 5/1972 | Lemecha | 118/57 |
| 3,680,762 | 8/1972 | Kondo | 118/74 |
| 3,705,457 | 12/1972 | Tardoskegyi | 118/63 |
| 4,121,535 | 10/1978 | Roberts et al. | 118/410 |
| 4,206,254 | 6/1980 | Schmeckenbecker | 427/96 |
| 4,321,289 | 3/1982 | Bartsch | 118/413 |
| 4,360,144 | 11/1982 | Cuddy et al. | 427/312 |
| 4,373,657 | 2/1983 | Fillon | 228/41 |
| 4,389,771 | 6/1983 | Cassidy et al. | 427/96 |
| 4,493,856 | 1/1985 | Kumar et al. | 427/42 |
| 4,513,662 | 4/1985 | Schneider | 118/407 |
| 4,566,624 | 1/1986 | Comerford | 118/410 |
| 4,608,941 | 9/1986 | Morris | 118/404 |
| 4,613,576 | 9/1986 | Nakamura et al. | 118/410 |
| 4,619,841 | 10/1986 | Schwerin | 118/58 |
| 4,622,239 | 11/1986 | Schoenthaler et al. | 118/410 |
| 4,695,481 | 9/1987 | Kawamata et al. | 427/312 |
| 4,710,399 | 12/1987 | Dennis | 118/410 |
| 4,779,980 | 10/1988 | Wallgren et al. | 228/219 |

OTHER PUBLICATIONS

Above References Cited in Ser. No. 181,775 Prosecution and Cited by Applicant by "FAX" filed 11-21-89, 11-22-89.
Jensen, "Self-Leveling Solder Tool IBM-Technical Bul.," vol. 11, #8, 1-1969, p. 1026.
Floyd et al., "Clean Room Robots", IBM Tech. Disclosure Bulletin, vol. 25, #4, Sep. 1982, pp. 2226-2228.

Primary Examiner—Willard Hoag
Attorney, Agent, or Firm—Sughrue, Mion, Zinn, Macpeak & Seas

[57] ABSTRACT

A tool employing a solder foot to deposit solder on a series of conductive surfaces as the tool moves. In one embodiment, non-wettable blade attached to the tool breaks the film. A pair of sensors coupled to a control circuit monitor the position of the solder foot and the position may be changed as a function of the operation to be performed, i.e. deposit, reflow, standby while tool is moved. In a second embodiment a discrete solder mass is extruded and deposited on a preheated pad. In a third embodiment, solder wire is delivered to an ominidirectional tool for deposition.

14 Claims, 7 Drawing Sheets

TOOL DIRECTION

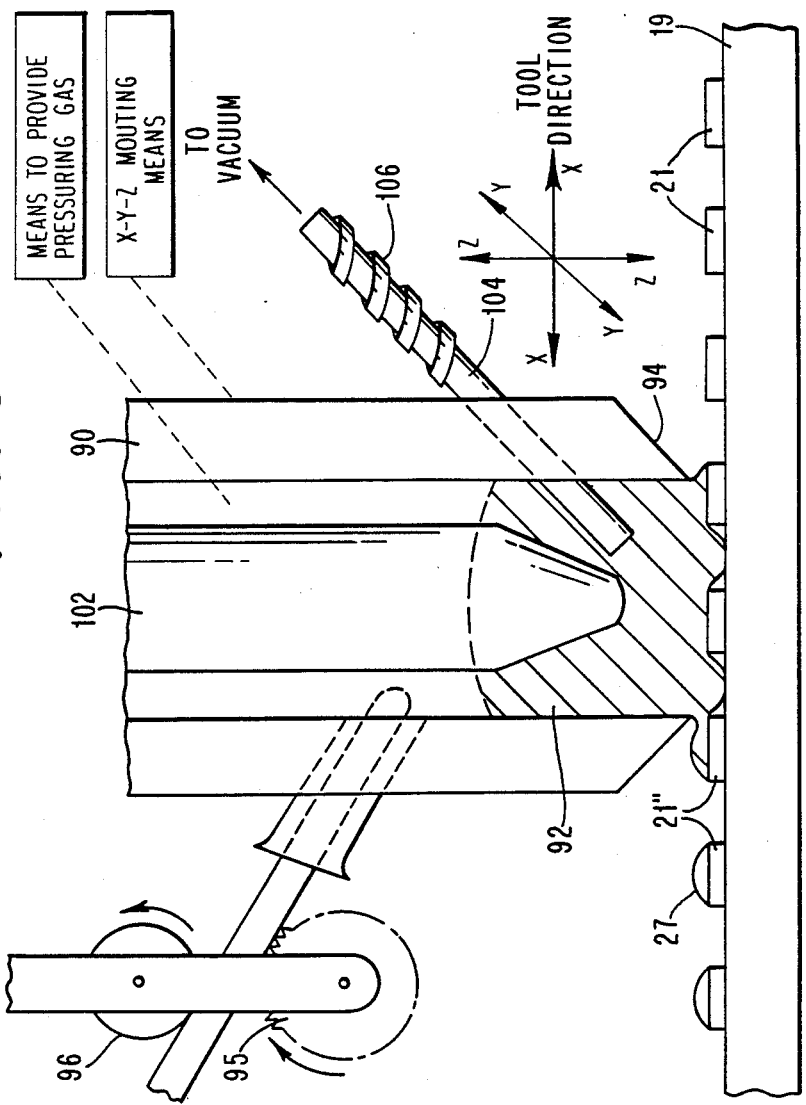

SOLDER DEPOSITION SYSTEM

This is a division of application Ser. No. 181,775 filed Apr. 15, 1988 now U.S. Pat. No. 4,898,117.

BACKGROUND OF THE INVENTION

1. Field of the Invention

This invention relates to an improved system of soldering and in particular to an improved technique of depositing solder onto solder wettable contact pads with a substantially uniform amount on each pad.

II. Description of the Prior Art

Solder distribution onto mounting pads for surface mount boards has in the semiconductor industry generally been accomplished utilizing a screening process. In this technique, art work and screens must be fabricated having the solder deposition pattern. Then, a precision alignment process is carried out wherein the solder is screened onto the surface mount pads. The solder paste used for the process requires substantially long cure and bake times. Thus, in addition to the complexity of the alignment process, this prior art technique is relatively time consuming.

The prior art technique utilizing screening is further complicated by a requirement that the pattern mixes very fine lead pitch and width surface mount pads along with standard surface mount parts. For example, in the case of tape automated bonding the pitches vary from 4 to 20 mils while, the standard surface mount parts have pitches in the range of 20 to 50 mils. Thus, the process requires that different amounts of solder be distributed on various parts of the board. Given the precision required, it is common to utilize separate screening steps, one for very fine lead pitch and width surface mount parts and second for the standard surface mount parts. There is the possibility of damaging the solder deposited in a previous step when multiple screening operations are carried out. Additionally, screening fine line solder presents a problem because the solder paste tends to stick in the openings of the screen as the openings get progressively narrower.

Another problem inherent in prior art screening systems is the difficulty of performing rework. Once a defective part has been removed there is no currently available technique to replace the solder on the board site. The solder which remains on the pads would be variable in thickness since there is no way to control the amount which remains with each lead of the part as it is being removed. While techniques exist to totally remove the solder after the part has been removed, replenishing by screening an isolated site is not yet feasible.

The prior art is also replete with a variety of techniques to deposit solder across the surface of a printed circuit. Typical techniques are so-called dip-soldering and wave-soldering. Wave-soldering involves pumping a molten solder through a nozzle to form a standing wave. In this process the entire side of an assembly containing printed conductors with the leads from the circuit components projecting through various points generally travels at a predetermined rate of speed over the standing surface of the wave of molten solder. The lower surface of the assembly is placed into contact with the upper fluid surface of the wave. By this technique, the solder wave in the first instance wets the joining surfaces and promotes through-hole penetration. This in turn helps to assure the formation of reliable solder joints and fillets. Wave soldering is illustrated in U.S. Pat. Nos. 3,705,457 and 4,360,144. An example of an immersion technique is illustrated in U.S. Pat. No. 4,608,941 wherein panels are immersed in a liquid solder bath and then conveyed to an air knife which levels the molten solder on the panels. The air knife is therefore used to effectively clear the panels of excess solder and only the printed patterns retain the solder.

Another example of a solder leveler is illustrated in U.S. Pat. No. 4,619,841. The technique is used in conjunction with dip-soldering techniques. Other techniques of selective deposition of solder onto printed circuit patterns are described in U.S. Pat. Nos. 4,206,254; 4,389,771; and 4,493,856.

U.S. Pat. No. 3,661,638 is also directed to a system for leveling and controlling the thickness of a conductive material on the walls of through-holes of a printed circuit board. The technique, for removing the excess amount of conductive material employs heating to melt a conductive material after it has been deposited and then, while the conductive material is in the plastic state, gyrating the board to cause the plastic material to move circumferentially about the through-hole and flow axially through the through-hole.

Summary of the Invention

Given the deficiencies of the prior art it is an object of this invention to define a system employing a tool which is usable either by hand or under robotic control that permits a redistribution of reflowed solder to pads on a surface mount board.

It is a further object of this invention to define a tool which allows the deposition and reflow of solder on pads of surface mount boards without the requirement for artwork, solder screens, or solder paste.

Yet another object of this invention is to define a system employing a tool which will apply solder in a fine line pattern to circuit cards while at the same time deposit solder in varying line widths.

A still further object of this invention is to define a tool that automatically regulates the amount of solder applied to a circuit card regardless of the condition of the amount of solder left on the card after part removal.

These and other objects of this invention are accomplished by means of a tool which deposits onto solder wettable contact pads solder in substantially uniform amounts on each pad. The tool, one embodiment comprises a solder reservoir or plenum, a heating element to melt the solder, and at the bottom of the reservoir, a foot which passes over the contact pads to be wetted with solder.

The foot employs first and second sensors to control the flow of solder from the foot. The foot itself has a forward end for the release of liquid solder and a back end for holding a shaping element. The foot thus has a cavity therein which extends to the bottom and to the forward end. The cavity is connected to the solder reservoir. At the back of the foot, a non-solder wettable blade is placed for removing excess material and providing shape control. The amount of solder flowing out of the foot is controlled as a function of a vacuum system which works in cooperation with the first and second sensors on the solder reservoir. The first sensor is located in the interior of the cavity and is used to maintain an appropriate level of solder in the cavity in a tool stand-by mode.

The second sensor is disposed at the forward edge of the cavity at the front portion of the foot. This sensor is employed to control the quantity of solder that resides in the foot during the deposition mode.

In accordance with this invention, solder in this embodiment is deposited in the following manner. The non-solder wettable substrate generally has an array of solder wettable contact pads. The foot is brought onto the substrate and maintained at a sufficient, pre-determined distance above the substrate. The distance is maintained so that contact to the substrate or the pad does not occur. Solder is permitted to flow out of the foot by switching to the second sensor which monitors the shape of the solder mass emerging from the front of the foot. The solder contacts the substrate or pad at the bottom of the foot. Solder tends to bulge out of the front cavity of the foot as a function of flow rate. As the foot is moved over the contact pads in the direction of the front of the foot, the pad is covered with solder. A non-wettable blade at the back end of the foot breaks the surface tension of the solder, thus removing the bridge between adjacent pads as they emerge from the rear end of the tool. The foot can be passed over an array of pads in one direction and then its direction can be changed. The foot will deposit a substantially uniform amount of solder onto each contact pad.

In a second embodiment of this invention the tool has a pressured reservoir and a series of openings on the bottom to produce a discrete mass of solder protruding therefrom. A heater is positioned to move with the tool and is located upstream to preheat the pads. As the tool passes over a pad a discrete drop of solder contacts the preheated pad. By controlling the rate of movement and reservoir pressure, the drop size and deposition rate can be determined.

In a third embodiment, the tool is omnidirectional and solder wire is delivered in metered amounts. A heater in the tool melts the solder to form a liquid mass for deposition. The tool has an omnidirectional non-wettable surface to break the surface tension. The solder may be removed using a vacuum coupled removal pipe when the operation is completed.

In all embodiments the tool is computer controlled so that movement over an array of pads can be accomplished. Depending on the technique used to form the solder for deposition, the tool may be unidirectional and rotational or omnidirectional.

This invention will be described in greater detail by referring to the drawings and a description of the preferred embodiments which follows.

BRIEF DESCRIPTION OF THE DRAWINGS

FIGS. 7A-7E illustrate configurations of various orifice patterns; and

FIG. 8 is a side elevation view of a third embodiment of this invention.

DESCRIPTION OF THE PREFERRED EMBODIMENTS

Figure 1:
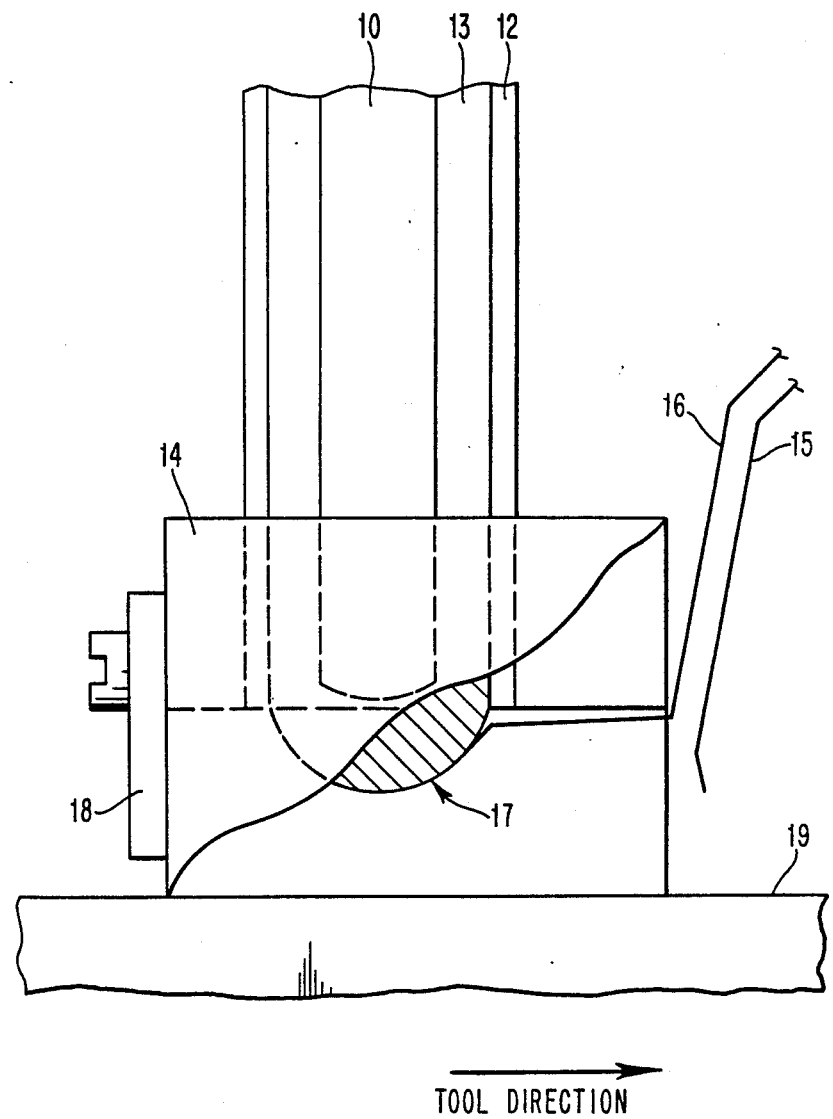
FIG. 1 is a schematic side view of the tool in accordance with a first embodiment of this invention in the stand-by or stop reflow mode.
Figure 2:
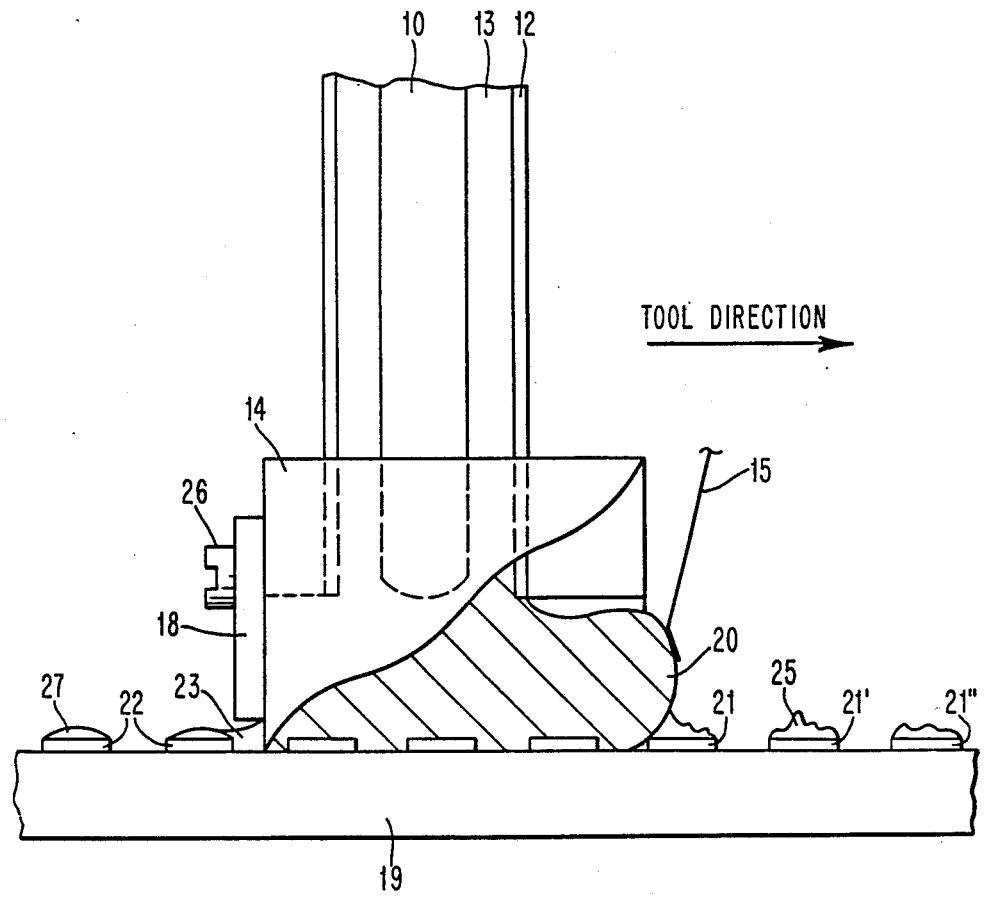
FIG. 2 is a side elevation view illustrating the tool in accordance with the first embodiment in the reflow mode with the foot extended beyond the leading edge of the head.
Figure 3:
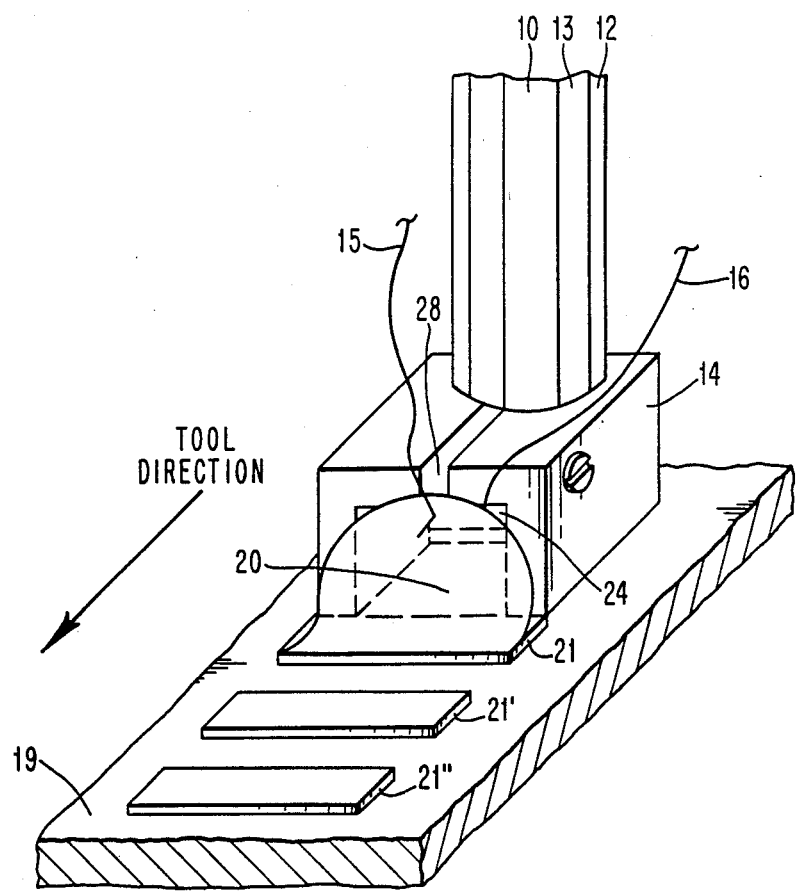
FIG. 3 is a schematic perspective view illustrating forward movement of the tool.

Referring now to FIGS. 1-3, the description of the tool forming a part of this invention will be described. FIG. 1 illustrates the tool in the stand-by or stop reflow mode. A central rod 10 formed of a conductive material such as copper is employed as a heat source, An annular outer wall 12 is used as a retaining wall for a solder column 13. Thus, as illustrated in FIG. 1, the liquid solder column 13 is heated by the conductor 10 and maintained by the outer wall 12. This solder column is maintained in a tool head 14. As illustrated in FIG. 1, the solder column 13 distends about a bottom portion of the conductor 10 to have a lower molten solder tip 17. Such is illustrated below the cutaway line in FIG. 1.

A pair of sensors 15 and 16 are used to maintain the shape of this solder tip. Sensor 15 is an external tungsten wire sensor for the solder foot in the reflow mode. Sensor 16 is a solder wire utilized in the stand-by mode and as illustrated in FIG. 1, sensor 16 is in contact with the tip 17 of the solder foot. Sensors 15 and 16 are coupled to the sensor circuit of FIG. 5 to be described herein.

FIG. 1 illustrates the vertically adjustable non-wettable blade 18 which is coupled to the tool head 14 by a convenient attachment technique such as a tapped screw or the like illustrated in FIG. 1. Surface 19 represents the workpiece.

FIG. 2 illustrates the tool in the reflow mode with the foot 17 now extended beyond the leading edge of the head to form a protruding zone 20. The position of this leading edge 20 is monitored by the sensor 15. This configuration of the solder is different from that illustrated in FIG. 1 where the solder foot is withdrawn having a leading edge 17 monitored by the sensor wire 16.

In operation, as illustrated in FIG. 2, the sensor wire 15 monitors the size of the foot by determining the position of the leading edge 20. FIG. 2 illustrates only a small number of the typical pads 21, 22 and 23 on the surface of the workpiece 19. As illustrated, solder 25 which exists on the pads 21 ahead of the tool has an irregular pattern because a part may have been removed leaving an irregular amount of solder. FIG. 2 illustrates pads 22 having uniform solder deposition 27 after the tool has passed. As illustrated in FIG. 2, in Zone 23, the solder film is broken by means of a height adjustable non-wettable blade 18.

FIG. 3 illustrates in schematic view the forward movement of the tool in typical use. As illustrated in FIG. 3, the tool head 14 comprises an open inverted U-shaped channel 24 defined by the housing. The solder column comprising the conductor 10 and the sheath wall 12 is positioned on the top of the head 14. The foot 20 therefore may extend beyond the opening 24 to wet the mounting pads 21, 21′, 21″ in succession as the tool moves in the direction illustrated in FIG. 3. Thus, the pads are encountered by the solder foot and are bridged together while under the tool head 14. As the tool head 14 passes over each of the mounting pads, the non-solder wetting blade 18 breaks the solder film so that a uniform coating exists on each pad.

FIG. 2 illustrates the action of the blade 18. Once the solder film has been broken, the effect of surface tension causes the solder to pull back into the foot 20 and simultaneously, the deposited portion 27 to spread onto the pad 21 in a uniform manner. The blade is vertically adjustable by manual means (set screw 26) or automatically. Additionally, the blade may be excited by a source of high frequency to provide vibratory motion. Sonic, piezoelectric or mechanically induced excitation may be employed. When the tool reaches the end of a row of pads. 21, etc., with the solder thus deposited or reflowed, it may be switched to a stand-by mode by switching from the sensor 15 to the sensor 16. This has the effect of withdrawing the solder foot from the configuration illustrated in FIG. 2 to that illustrated in FIG. 1. The tool may then be turned to address a row of pads at right angles to those just reflowed or alternatively, to lift the tool in preparation for moving to another site on the circuit board.

Given the mode of operation, this invention does not require critical alignment over the pads. The path of travel is typically defined by a solder mask. So long as the tool is roughly positioned over the pads, deposition will occur. That is there is no need to align on the center line of the row of pads. Also, while not illustrated, a dam may be employed to confine the flux. The invention thus permits a one pass technique of solder deposition. While the drawings illustrate a tool-down mode of use, the tool may also be employed in a tool-up configuration.

Figure 4:
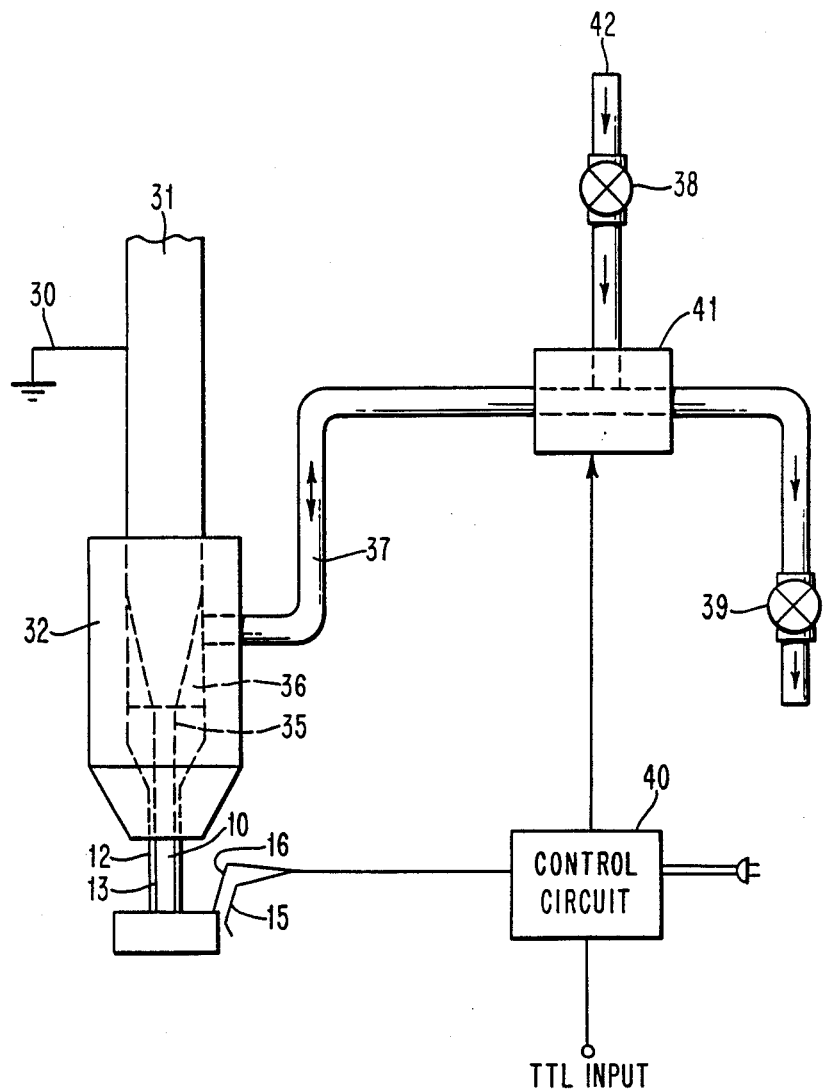
FIG. 4 is a schematic drawing of a complete instrument used in accordance with the first embodiment this invention.

Referring now to FIG. 4 the system of this invention is illustrated. In FIG. 4 those elements of FIGS. 1 through 3 which are the same components provided with like numerals. The heat source 10 is coupled to a mass heat source 31. As illustrated in FIG. 3 the source 31 is grounded via ground 30. This allows for simple operation of the sensor wires 15 and 16 as well as circuit safety of a populated circuit board. As illustrated in FIG. 4. the solder reservoir container 32 is disposed concentrically outside the source 31. The container 32 contains a solder reservoir 35 which supplies solder to form the column 13. The solder reservoir 35 is disposed around the heat source 31. The reservoir tapers into the retaining wall 12.

In order to maintain a sufficient solder foot, pressure on the reservoir is maintained by a gas column 36. The pressure provided by this gas column above the reservoir maintains the reservoir position and is the technique of applying alternative positive and negative pressure on the solder to create a solder foot and maintain its position as a function of that determined by sensor wires 15 and 16. As illustrated in FIG. 4, gas under pressure is admitted from a source 42 through a regulator 38 to define a positive gas flow through conduit 37 into the reservoir at a portion 35 above the solder reservoir 35. Similarly, reservoir 39 is used to vent gas and thus define a negative pressure differential through the system.

A solenoid valve 41 is used either to supply positive pressure gas through conduit 37 or to define the negative pressure flow for purposes of the venting via regulator 39.

Thus, as illustrated in FIG. 4, depending on the pressure applied in zone 36, the foot of the solder column may be either extended (by the application of positive pressure in zone 36) or retracted (by the application of negative pressure using regulator 39). Those two conditions are monitored by means of sensors 15 and 16 which provide input into control circuit 40 which is used to control the position of the solenoid valve 41.

Figure 5:
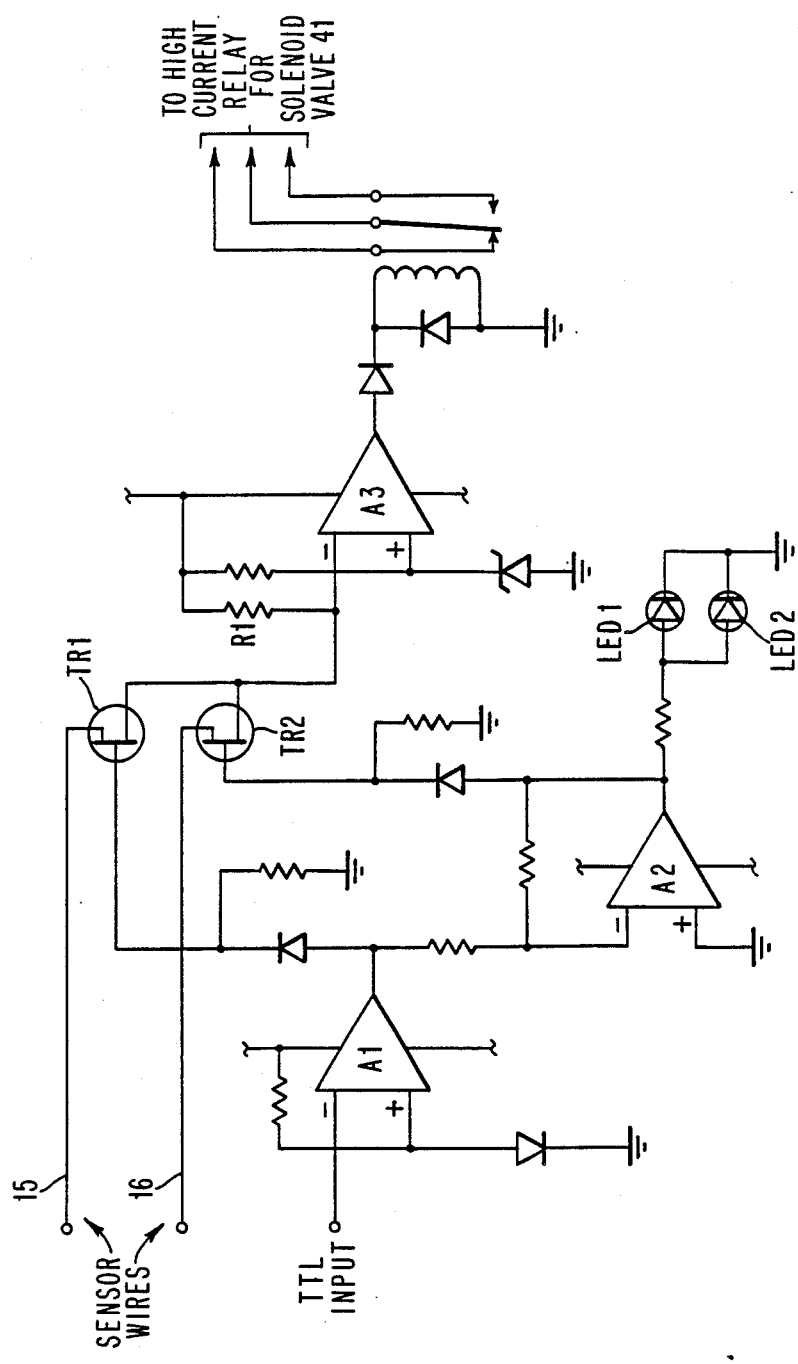
FIG. 5 is a circuit drawing of the control circuit for computer and sensor wires that permits operation of the reflow in accordance with the first embodiment of this invention.

Referring now to FIG. 5, a simple control circuit for computer and sensor wire control of the relay/solenoid system of FIG. 4 is depicted. This circuit is used to control the operation of the reflow tool.

Op-amp A1 is a comparator providing a TTL signal of either 0 or 5 volts to be used as a computer input to direct the tool to be either in a reflow or standby mode. The output also provides activation for sensors 15 or 16. This is accomplished by having the transistors TR1 and TR2 reverse bias so that one is conducting while the other is not. Such is accomplished by means of a phase inverter A2 which inverts the output of Op-amp A1 and directs it to the gate of transistor TR2. One or the other of sensor wires 15 or 16 is then connected by a low impedance path through transistor TR1 or TR2 to the input of comparator A3. The one megaohm resistor R1 pulls the sensor wire 15 or 16 and inverting input high. The state then reverses when solder touches the wire shorting the high voltage low current potential present at the sensor wire and inverting the input terminal to ground. This is reflected by a change in state of the output of comparator A3 resulting in the relay K1 being put in an alternative condition. Relay K1 is then used to drive a high current relay to toggle the solenoid valve 41 of FIG. 4. A pair of LED's, LED-1 and LED-2 are used to indicate the state of the circuit at any given time.

The values of the various resistor and Zener diodes used in the circuit of FIG. 5 are illustrated. The transistors may be a pair of 2N5465 transistors.

In order to confirm that this invention provides results which are at least comparable with those obtained utilizing conventional solder paste screening, the following experiment was carried out. 40 samples consisted of 6.5×3.5 inch type cards having 10 mil pads on 20 mil centers and 4 mil pads on 8 mil centers for component attachment. Solder application was carried out utilizing two methods. The first method consisted of the application of solder paste utilizing a thick film screen printer. The paste was a Cermalloy 3801 paste and the printer a Presco thick film screen printer Model 8115. This was used to the 10 mil wide footprints on 20 mil centers utilizing a 2 mil thick brass stencil. Next, the paste was dried at 120° C. for 10–15 minutes followed by vapor phase reflow of the dry paste at 215° C. for 38 seconds and HTC vapor phase reflow system Model 912W/elev. utilizing fluorinert 5311 fluid. The card was subsequently cleaned in Freon TMS. This process represents a conventional screen solder technique.

The second method of solder application was utilizing the solder foot technique of this invention. For purposes of this experiment, sensors 15 and 16 were omitted. Solder is deposited on the pads utilizing a solder head of the type illustrated in FIGS. 1–3 containing molten solder. As the tool passes over the pads it bridges the pads together. At the trailing edge of the solder head, a non-wettable blade allows the solder surface 10 to be broken leaving a well defined amount of solder on each pad. The amount of solder remaining on the pad is defined by a function of both height of the non-wettable blade as well as the geometry of the wettable area of the pad. The dimensions of the tool head may be made very small so as to accommodate narrow sections of populated cards. The procedure consists of fluxing the board and then traversing the solder head across the row of pads manually after adjustments of the head and the blade.

The speed of travel of the solder foot in these manually prepared boards was approximately 0.5 inches/second with the solder temperature set to be 300° C. utilizing an Alfa 102 (unactive) flux. That technique was designed to deposit 2-3 mil solder on 10 mil wide pads and approximately 0.5 mil solder on 4 mil wide pads. The solder pads were examined by optical microscopy. Samples were cross-sectioned and the solder thickness was measured by metallographic technique utilizing an LEC 0300 Metallograph. Thickness measurements were made on two sets of parallel pads on each of the cards. High magnification (400× and 1000×) pictures were taken to show the microstructure, solder profile and intermetallic regions. Measurements of individual solder thickness on two series of 10 mil wide pads, mainly screened and reflowed and pads which were soldered utilizing the solder flow technique were tabulated. The table below provides averages, standard deviations and maximum/minimum values.

TABLE

| Parameter of Solder Thickness Measurements (mils) | | | | |
|---|---|---|---|---|
| | Screen, Past, Reflow | | Solder Foot | |
| Parameters | Side A | Side B | Side A | Side B |
| Average | 3.44 | 3.46 | 3.84 | 3.84 |
| Std. Dev. | 0.16 | 0.21 | 0.18 | 0.08 |
| Maximum | 3.77 | 3.89 | 4.11 | 4.01 |
| Minimum | 3.11 | 2.72 | 3.33 | 3.62 |

As indicated, the two techniques are comparable in terms of average thicknesses and reproducibility. Both techniques produced a thin layer of intermetallics as expected. The extent of the intermetallics is a function of the time-temperature profile the pads experience by the two techniques. In either of the cases, the extent of the intermetallics is not considered to impact either the solderability or reliability on the 10 mil wide pad.

In either of the two pad sizes used, no bridging was observed using the solder foot technique. Stencil material selection and fabrication, solder bridging and solder particle size are limitations of paste screening and reflow techniques as footprints become smaller and smaller.

It can therefore be seen that in accordance with this embodiment of the invention, a unique tool permits the distribution of reflowed solder to pads on a surface mount board. This is accomplished by employing a solder-carrying head with a non-wettable blade whose solder volume is monitored through a sensor feedback system. The technique may be used either by hand or under robotic control. As the head of the tool passes over the pads it bridges the pads together with solder. The head, however, at its trailing edge utilizes a non-solder wettable blade which allows the solder surface tension to be broken. This leaves a well defined amount of solder on each pad. The solder which is deposited is a function of both the height of the non-wettable blade as well as the geometry of the wettable area of the pad. In the case of this invention, because the pads are initially bridged together under the tool, and have an excess of solder on them, critical alignment of the tool is not required. Rather, the solder distributes itself evenly across the pad after having the blade pass over. Unlike screening techniques which are inherently limited by dimensional constraint and alignment problems, the dimensions of the head itself will be made very small to accommodate isolated and/or narrow sections of populated circuit boards. Also, in accordance with this invention it is possible to distribute solder on narrow pads, for example having 10 mil wide lines and a 20 mil pitch at an acceptable rate of processing.

Figure 6A:
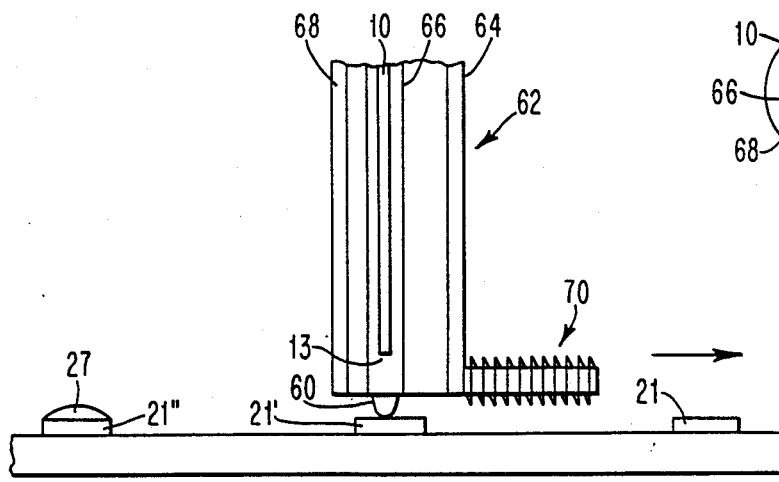
FIGS. 6A and 6B, respectively, are side elevation view and bottom view of a second embodiment of this invention.
Figure 6B:
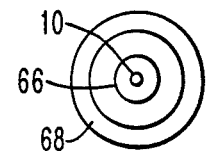

Referring to FIGS. 6A and 6B a second embodiment of this invention is depicted. In this embodiment, the substrate 19 is the same as that of the first embodiment. The pads 21 are also the same. This embodiment departs from the first embodiment in that rather than extruding a solder foot, a discrete solder ball 60 is produced from the tool 62. That tool comprises an outer shell 64 having a series of annular chambers. The central chamber 66 contains a heater 10 for heating of the mass of liquid solder 13. An outer annular chamber 68 dispenses a hot forming gas over the surface.

A heater 70 is used to preheat the pads 21 prior to the deposition of the solder ball 60.

As the tool 62 moves in the direction of arrow in FIGS. 6A, the heater 7 first passes over pad 21. The temperature of the pad is then elevated to the point that it will receive a discrete liquid solder drop 60 and not result in a cold solder joint. When the central portion of the tool containing the solder mass 13 passes over the pad 21, solder under pressure from the chamber 66 produces a discrete amount of solder in the form of a drop 60. That solder mass once it contacts the preheated pad 21 is deposited thereon with the mass breaking off by movement of the tool. The result is illustrated in FIG. 6A relative to the pad 21" is a uniform deposition of the solder 27 onto the pad 21".

This system may be used in a unidirectional technique wherein the tool turns always proceeding in the direction wherein the heater 70 precedes it or, in an omnidirectional mode wherein no discrete turning of the tool is required. That is, while the tool may change direction to follow a predetermined pattern, under computer control, the tool itself need not rotate.

Figure 7A:
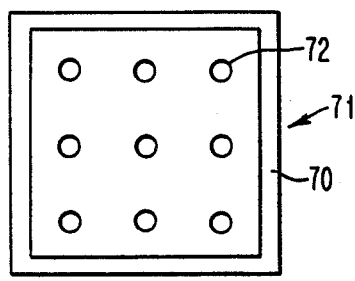
Figure 7B:
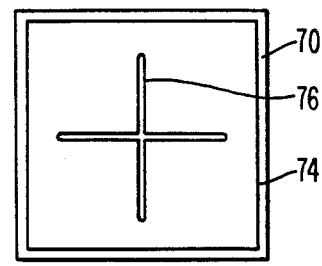

Referring then, to FIGS. 7A and 7B two omnidirectional solder emitting heads are depicted. In FIG. 7A the tool 70 has a regular series of holes 72. The spacing of those holes presented only for purposes of illustration, it being understood that they will become compacted or spread so that the combined emission is one solder mass which emerges upon extrusion.

The head 74 in FIG. 7B utilizes symmetrical cruciform shape 76. In this embodiment the solder is extruded as one mass which tends to merge at the central axis of the tool to form the solder mass which is depicted schematically in FIG. 6A.

Figure 7C:
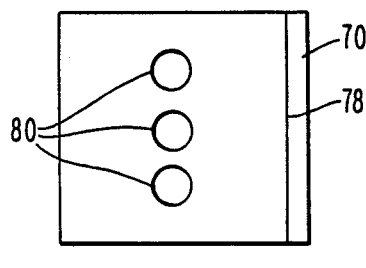
Figure 7D:
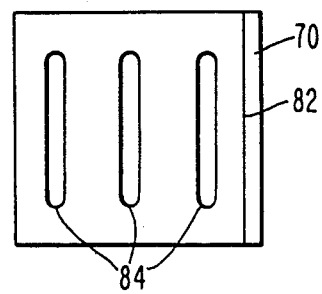

Two unidirectional embodiments are illustrated in FIGS. 7C and 7D. In FIG. 7C the tool 78 comprises a series of three holes 80 openings and at 7D the tool 82 comprises a series of elongated slots 84. It is apparent that in the tool of FIGS. 7C and 7D rotation is necessary as the tool itself changes direction so that holes 80 or slots 84 are aligned perpendicular to the direction of travel.

This embodiment does not employ the non-wettable blade to achieve separation. Such is deemed necessary but, may be used as an option. Rather, complete separation occurs because a discrete solder mass is extruded from the solder column which is maintained under pressure. In that regard, the system schematic of FIG. 4 may be employed to the extent that the system is maintained under pressure utilizing solder equipment.

Referring now to FIG. 8 a third embodiment of the solder deposition tool of this invention is illustrated.

This tool is omnidirectional in terms of its use, that is it needs no rotation to accomplish solder deposition on pads at various angles to the tool. The retaining wall 90 for a small solder volume may employ various shapes for the bottom edge 94 which serves as a non-wettable blade as in the embodiments previously discussed. A sharp edge is shown in FIG. 8 although a rounded or squared off version is also useable.

This tool also differs from the previous embodiments in that the solder volume is not regulated by means of a pressurized gas volume, but is created and removed and discarded as needed during the tool use and movement. At the beginning of a cycle, a thermally isolated gear wheel 95 and pressure wheel 96 are used to deliver a known length of wire solder 98 into the solder reservoir area by way of an orifice 100. This solder melts on the heater source 102, and flows to the bottom of the reservoir area, forming a small solder volume 92. The small solder volume eliminates the requirement for a negative back pressure to maintain the solder in the reservoir area during the reflow mode. This is due in part to the wetting action of the solder to the heater source 102 surface, as well as the minimized force of gravity acting upon the reduced amount of solder in the reservoir.

As the tool moves in the desired direction, it delivers precise amounts of solder on the pads 21 which emerge from the trailing section of the tool by the method of disturbing the surface tension of the solder by means of a non-wettable blade, in this case edge 94 in a manner described in previous embodiments. In this case, the blade is circular, and comprises the bottom edge of the retaining wall 90, which accounts for the omnidirectional capability of the tool. The retaining wall may be fabricated of any non-wettable material, such as aluminum, quartz, ceramic, etc. At the end of a row, or at the end of a tool cycle when the tool is to be raised and relocated, the solder volume in the reservoir is removed prior to raising the tool.

At the end of a row, or at the end of a tool cycle when the tool is to be raised relocated, the solder volume in the reservoir is removed prior to raising the tool. This is accomplished be means of applying vacuum (not shown) to the chamber to which the solder removal pipe 104 is attached. This pipe may be heated by various techniques, to keep the solder from solidifying in the pipe. Shown is a heater comprises of nichrome wire 106 wrapped around the pipe 104. The pipe 104 may be made of electrically non-conductive material to simplify the electrical isolation of the nichrome wire, such as quartz. This solder removal scheme allows most of the solder to be removed from the reservoir, with the remaining solder clinging to the heater tip. The tool may be lifted from the substrate without fear of solder falling to the work piece.

Developments and modifications of this invention may be practiced without departing from the essential scope thereof. For example, a piston may be employed for pressurization instead of gas under pressure. In the first embodiment optical, magnetic or thermal sensors may be employed.

We claim:

1. Apparatus of applying liquid solder to a series of conductive surfaces comprising,
    an omnidirectional movable housing having a reservoir for liquid solder and a dispensing outlet whereby solder flows from said reservoir and forms a discrete mass that contacts a conductive surface as a solder film,
    means to preheat said conductive surface prior to contact by said discrete mass, and
    means to maintain said liquid solder in said reservoir under positive gas pressure.

2. The apparatus of claim 1 wherein said housing is movable omnidirectional and said dispensing outlet comprises a symmetrical array of ports.

3. The apparatus of claim 1 wherein said housing is movable omnidirectional and said dispensing outlet comprises a symmetrical port.

4. The apparatus of claim 1 wherein said housing is movable along a line and said dispensing outlet comprises a series of ports positioned perpendicular to the line of movement.

5. The system of claim 1 wherein said means to preheat comprises an annular chamber disposed in said housing around said reservoir, a source of gas under pressure and nozzle means to dispense said gas to surround said discrete mass of solder as it is emitted from said dispensing outlet.

6. The apparatus of claim 1 further comprising means in said reservoir to heat said solder.

7. The apparatus of claim 1 wherein said means to preheat said conductive surface comprises a flux preheater attached to said housing.

8. The apparatus of claim 7 wherein said flux preheater surrounds said housing.

9. The apparatus of claim 7 wherein said flux preheater is attached at a position ahead of said dispensing outlet in a direction of movement.

10. Apparatus of applying liquid solder omnidirectional to a series of conductive surfaces comprising:
    a movable housing having a reservoir for solder and a symmetrical dispensing outlet whereby solder flows from said reservoir and forms a discrete mass that contacts a conductive surface as a solder film,
    an omnidirectional means for moving said housing,
    means to deliver wire solder to said reservoir, a heating element in said reservoir to maintain said solder in a liquid from for release by said symmetrical dispensing outlet.

11. The apparatus of claim 10 wherein said symmetrical dispensing outlet comprises an opening at the bottom of said reservoir having a tapered wall terminating in an edge defining an omnidirectional non-wettable blade.

12. The apparatus of claim 10 further comprising a solder removal conduit connected to said reservoir and in fluid contact with liquid solder and, heater means to heat said conduit to prevent solder entrained therein from hardening.

13. The apparatus of claim 10 wherein said means to deliver solder comprises supply means to feed a predetermined amount of solder wire into said reservoir and wherein said heater melts said solder wire to a liquid volume for release.

14. The apparatus of claim 13 wherein said supply means to feed comprises a pair of rollers to feed solder wire, and a supply orifice for guiding said wire into said reservoir.

* * * * *